United States Patent
Domeij

(10) Patent No.: US 10,504,995 B1
(45) Date of Patent: Dec. 10, 2019

(54) SHORT-CIRCUIT PERFORMANCE FOR SILICON CARBIDE SEMICONDUCTOR DEVICE

(71) Applicant: SEMICONDUCTOR COMPONENTS INDUSTRIES, LLC, Phoenix, AZ (US)

(72) Inventor: Martin Domeij, Sollentuna (SE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/059,223

(22) Filed: Aug. 9, 2018

(51) Int. Cl.
*H01L 29/16* (2006.01)
*H01L 29/66* (2006.01)
*H01L 29/78* (2006.01)
*H01L 29/08* (2006.01)
*H01L 21/308* (2006.01)
*H01L 29/10* (2006.01)
*H01L 27/092* (2006.01)

(52) U.S. Cl.
CPC ........ *H01L 29/1608* (2013.01); *H01L 21/308* (2013.01); *H01L 29/086* (2013.01); *H01L 29/0878* (2013.01); *H01L 29/1033* (2013.01); *H01L 29/66068* (2013.01); *H01L 29/7802* (2013.01); *H01L 27/0927* (2013.01)

(58) Field of Classification Search
CPC ............. H01L 29/1608; H01L 29/1033; H01L 21/308; H01L 29/0878; H01L 29/7802; H01L 29/66068; H01L 29/086; H01L 27/0927
See application file for complete search history.

(56) References Cited

U.S. PATENT DOCUMENTS

| | | | |
|---|---|---|---|
| 2015/0108564 A1* | 4/2015 | Miura | H01L 21/046 257/329 |
| 2016/0276339 A1* | 9/2016 | Titus | H01L 27/0705 |
| 2017/0054017 A1 | 2/2017 | Takaki et al. | |

FOREIGN PATENT DOCUMENTS

WO     2017147296 A1     8/2017

\* cited by examiner

*Primary Examiner* — Anthony Ho
(74) *Attorney, Agent, or Firm* — Brake Hughes Bellermann LLP

(57) ABSTRACT

A semiconductor device includes a source region configured to provide at least a portion of a MOSFET source of a MOSFET and at least a portion of a JFET source of a JFET. The semiconductor device includes a JFET channel region in series with the source region and a MOSFET channel region of the MOSFET, and disposed between a first JFET gate and a second JFET gate. The semiconductor device includes a JFET drain disposed at least partially between a gate insulator of a gate of the MOSFET and at least a portion of the JFET channel region, and in electrical contact with the first JFET gate and the second JFET gate. Various example implementations of this type of semiconductor device provide a SiC power MOSFET with improved short-circuit capability and durability, with minimal impact on $R_{DS\text{-}ON}$.

16 Claims, 12 Drawing Sheets

SHORT-CIRCUIT PERFORMANCE FOR SILICON CARBIDE SEMICONDUCTOR DEVICE

TECHNICAL FIELD

This description relates to silicon carbide semiconductor devices.

BACKGROUND

Silicon Carbide (SiC) semiconductor devices, such as SiC MOSFETs, have a number of advantageous features, e.g., in comparison to traditional Silicon-based devices. For example, SiC MOSFETs are well-suited for high-power applications. SiC MOSFETs are capable of handling high voltages and high operating temperatures. Further, SiC MOSFETs have a low drain-to-source ON-resistance ($R_{DS-ON}$), (when designed with a short channel region) and fast switching with low power losses, resulting in highly-efficient operation.

However, some such advantageous features are also associated with potential difficulties or challenges. For example, the above-referenced short channel regions may result in current rising to very high levels during short-circuit operations (e.g., $V_{DS}$=600-800V for a 1200V SiC MOSFET). Further, lower $R_{DS-ON}$, although an advantage during normal operations, leads to worse short-circuit durability. For example, short-circuit current density increases in such scenarios, which leads to increased power density and lower short-circuit time to failure.

SUMMARY

According to one general aspect, a semiconductor device includes a source region configured to provide at least a portion of a MOSFET source of a MOSFET and at least a portion of a JFET source of a JFET. The semiconductor device includes a JFET channel region in series with the source region and a MOSFET channel region of the MOSFET, and disposed between a first JFET gate and a second JFET gate. The semiconductor device includes a JFET drain disposed at least partially between a gate insulator of a gate of the MOSFET and at least a portion of the JFET channel region, and in electrical contact with the first JFET gate and the second JFET gate.

The details of one or more implementations are set forth in the accompanying drawings and the description below. Other features will be apparent from the description and drawings, and from the claims.

DETAILED DESCRIPTION

During normal operations of SiC MOSFETs, it is possible for undesired short-circuit currents to occur. For example, an erroneous mis-timing of turn-on of the SiC MOSFET may occur and cause a short-circuit current. Short-circuit protection mechanisms may be utilized, but the SiC MOSFET must be able to withstand the undesired short-circuit current until such mechanisms can be activated.

Although it is possible to improve a short-circuit performance profile of a SiC MOSFET by, e.g., increasing the channel length being used or by reducing the channel density on the die, such increases also result in disadvantages during normal operations, such as higher $R_{DS-ON}$, higher on-state power losses, higher costs, and slower switching.

This document describes various example implementations of a SiC power MOSFET with improved short-circuit capability and durability, with minimal impact on $R_{DS-ON}$. As described in detail below, the various example implementations enable an improved trade-off between short-circuit withstand capability and $R_{DS-ON}$, including providing short-circuit current saturation (as an alternative or addition to a reduction of channel density, or mere increase in channel length or series resistance).

More particularly, the various example implementations provide the above and additional features and advantages by, e.g., adding a JFET with a double-sided gate shorted to its source, in series with the MOSFET channel. As described in detail below, the various example implementations of a power SiC MOSFET with the above-referenced included JFET provide an improved trade-off between short-circuit performance and $R_{DS-ON}$, while requiring, in some implementations, only a single additional masked implantation step beyond that which is used in conventional SiC power MOSFET manufacturing techniques. Moreover, the short-circuit performance is improved with little or no influence on the electrical characteristics of the SiC power MOSFET, while offering the ability to tune the power MOSFET for a wide range of requirements regarding short-circuit performance and $R_{DS-ON}$.

In particular, the double-sided gate of the included JFET provides a reduction in sensitivity to surface conditions (e.g., interface charges and SiC consumption that may occur during processing, such as during oxidation or dry etching). For these and other reasons, the described implementations provide a stable, tunable, and durable approach to obtaining improved short-circuit performance in a SiC power MOSFET.

Figure 1:
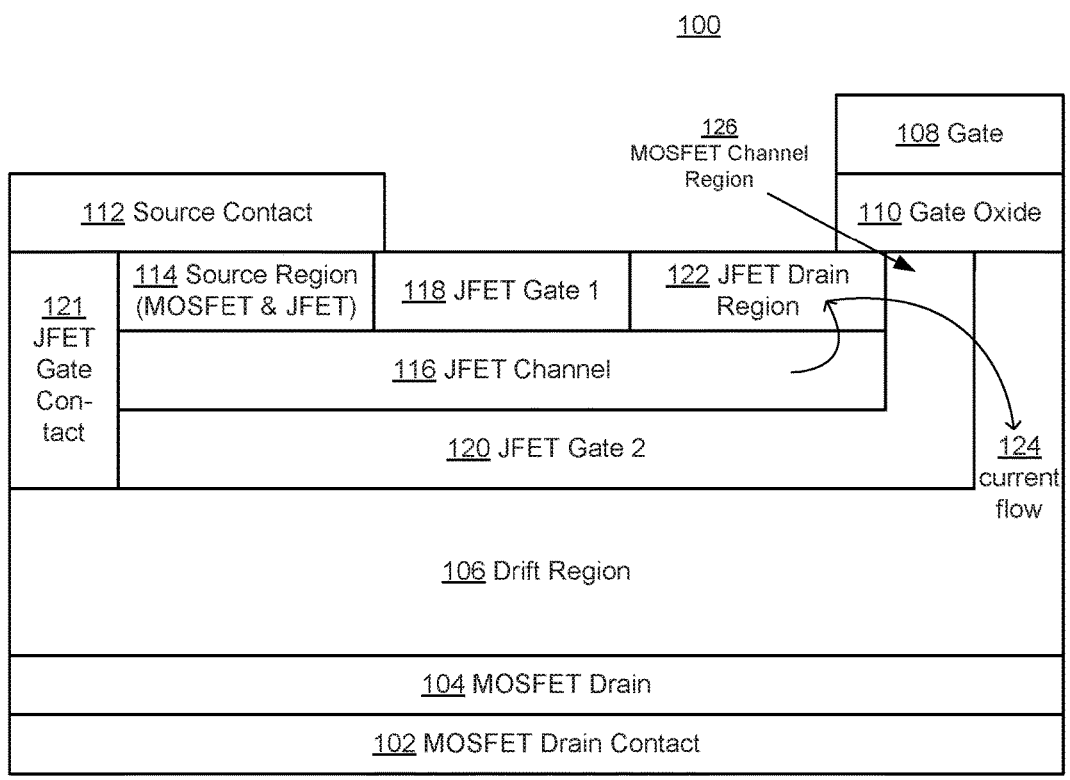
FIG. 1 is a block diagram of a SiC power Metal Oxide Semiconductor Field Effect Transistor (MOSFET) with a series connected junction gate field effect transistor (JFET) having a double-sided gate shorted to its source region for improved short circuit performance.

FIG. 1 is a block diagram of a SiC power MOSFET 100 with a JFET (114, 116, 118, 120, 122, as described below) having a double-sided gate (118, 120) for improved short circuit performance. In the example of FIG. 1, the SiC power MOSFET 100 is a vertical power MOSFET device. Details of a manner(s) in which such a vertical power MOSFET device provides various functions and features in its normal capacities as a power transistor are generally not described in detail herein, except as may be necessary or helpful in understanding the short-circuit performance and related aspects of the MOSFET 100.

In FIG. 1, the MOSFET 100 is illustrated as including a drain contact 102 electrically connected to a drain region 104. A drift region 106 (also referred to in some contexts as an epitaxial layer) provides part of a current path for the current of the MOSFET 100. During normal operation, a voltage applied at a gate 108 that is disposed on an underlying gate oxide (insulator) 110 causes current 124 to flow through a source contact 112 and corresponding source region 114, flowing into a region 116 that is in series with the source region 114 (and that provides a channel for the JFET structure referenced above), and through a JFET drain region 122 to reach a MOSFET channel region 126.

Thus, as shown, the referenced JFET structure includes a first gate 118 and a second gate 120, as well as the drain 122. The second JFET gate 120 is electrically connected to the source region 114 and the source contact 112, and partially includes the MOSFET channel region 126 traversed by the current flow 124 as the current flow 124 proceeds through the drift region 106 and as the current flow 124 flows between the drain 104/drain contact 102 and the source region 114/source contact 112.

In general, and as described in detail, below, the MOSFET 100 of FIG. 1 thus illustrates a JFET structure (114, 116, 118, 120, 122) with a first gate 118 electrically-shorted to its source 114, and in series with the MOSFET channel region 126. Further, carefully controlled doping levels within the JFET channel 116 cause a lateral voltage drop along the JFET channel 116, and lead to pinch-off of the JFET channel 116 at high current (e.g., in short-circuit scenarios). This pinch-off leads to current saturation and reduced short circuit current, as described and illustrated, below.

Figure 2:
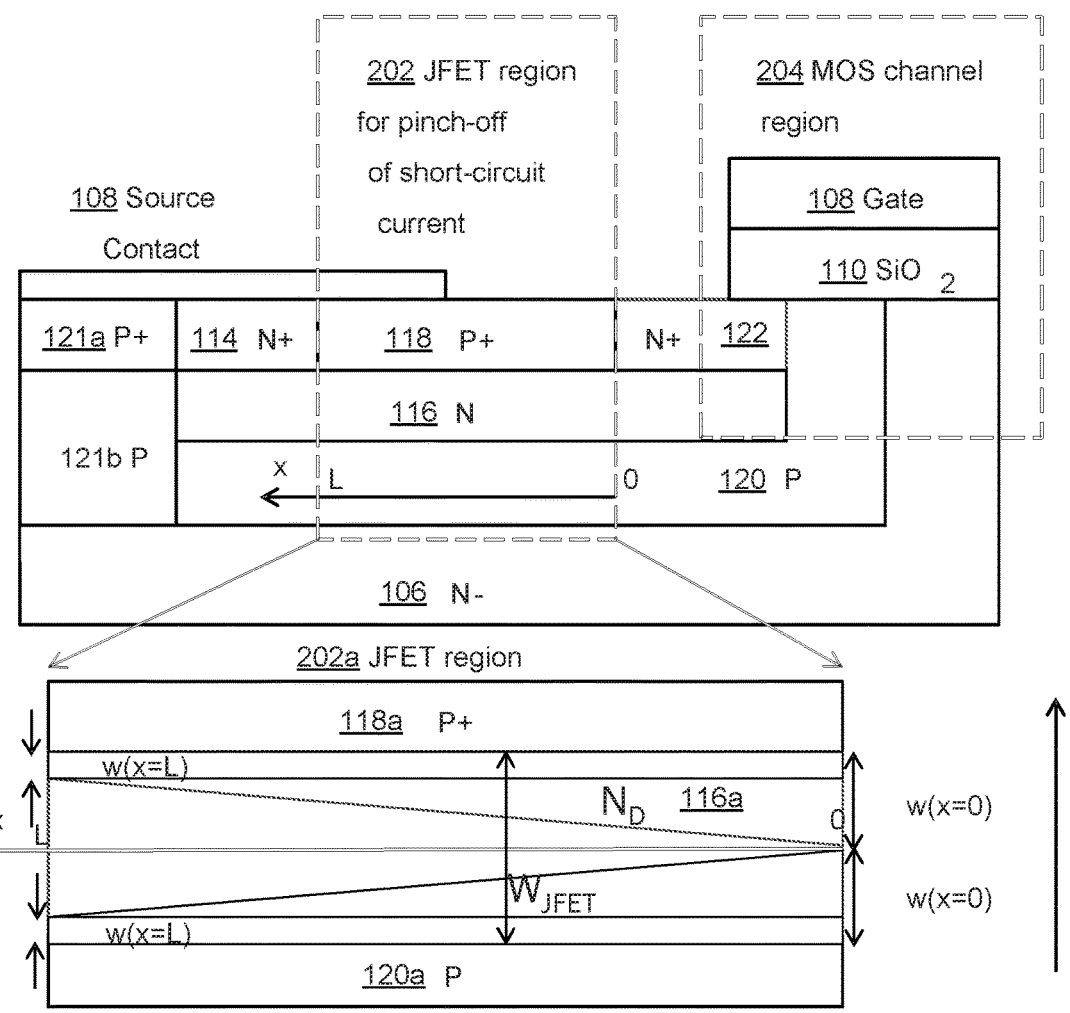
FIG. 2 is a block diagram additional example features of the implementation of FIG. 1, illustrating example conductivity types.

FIG. 2 is a block diagram additional example features of the implementation of FIG. 1, illustrating example conductivity types. With respect to FIG. 3, as well as FIGS. 4-8, below, various alternate implementations may have the illustrated conductivity types reversed.

In FIG. 2, cut-out 202 illustrates a JFET region (118, and portions of 116, 120) of the JFET structure (114, 116, 118, 120, 122), as well as an expanded view 202a of the JFET region 202. As shown, FIG. 2 illustrates N+ doping for source region(s) 114 and JFET drain region 122, P+ doping for first JFET gate 118, N doping for the JFET channel 116, P doping for the second JFET gate 120 (with P+ doping in a connection region portion 121a, and P doping in a connection region portion 121b), and N− doping for the drift region 106. Also in FIG. 2, the gate oxide (insulator) 110 is illustrated as $SiO_2$. Of course, the above conductivity types are merely for the sake of example, and could be inverted in other implementations.

As referenced above, the structure and operation of the implementations of FIGS. 1 and 2 are highly tunable. For example, the expanded JFET region 202a is illustrated as including an n-doping concentration $N_D$, and as having a width of the JFET channel of $W_{JFET}$, with a length of the JFET channel region L. By selecting absolute and relative values of these parameters $N_D$, $W_{JFET}$, and L, it is possible to control pinch-off and saturation levels of the short-circuit current, as described and illustrated below, e.g., with respect to FIG. 3.

In FIG. 2, it may be observed that the MOSFET 100 may be constructed with source implant regions 114, 116 having a high peak near the top surface (i.e., N+ in region 114), with a lower plateau (N) having the accurately controlled doping profile described herein. The doping level of the N+ region 114 may be independently controlled with respect to the doping level N of the channel region 116.

Further, an additional P+ implant 118 may be provided with higher doping than the N+ source 114, to create the first or top-side of the p-gate for the JFET pinch resistance described herein, where the source contact 108 also connects to the P+ region 118. As may be observed, the first gate 118 thus provides protection in the way of a physical and electrical barrier to any alteration or disruption of the structure and function of the JFET channel 116 (e.g., that may otherwise occur due to process-induced surface conditions such as interface charge, or SiC consumed by oxidation or dry etching).

During operations in different contexts, the MOSFET 100 may require or benefit from different degrees of the various characteristics described herein. For example, some operational contexts may be highly susceptible to frequent and/or large short-circuit currents. Other contexts may require relatively fast switching speeds. Thus, some operational contexts may benefit from a relatively larger on-resistance $R_{DSON}$ and a higher degree of short-circuit protection, while others may benefit from lower $R_{DSON}$ and associated faster switching speeds.

The MOSFET 100 provides an ability to tune structural and operational characteristics and achieve the types of tuning just referenced. For example, the doping $N_D$ of the region 116a of FIG. 2 may be selected to provide a desired level of additional series resistance when the MOSFET is in an on-state, but to pinch-off at a specified high current (e.g., short circuit).

In order to provide such tuning, the n-doping concentration $N_D$, the width of the JFET channel $W_{JFET}$ and the length of the JFET channel region L may be selected and configured to cause pinch-off to occur at a specified (short-circuit) current. For example, for a given value of L, it is possible to control the parameter that is the product of $N_D \cdot W_{JFET}$, which may be referred to herein as the JFET channel dose. Similar operational characteristics may be obtained by different constructions (e.g., for variations in one or more of $N_D$, $W_{JFET}$ or L) by maintaining a constant ratio of $(N_D \cdot W_{JFET})/L$. In other implementations, $N_D$ does not have to be constant, such as a doping profile in which an integral of the n-doping across the channel region has the same value as $(N_D \cdot W_{JFET})$.

In some example implementations, values for the above-referenced parameters may include a JFET channel length of L=1 μm, with $N_D=1.2 \cdot 10^{18}$ cm$^{-3}$ and $W_{JFET}=100$ nm. More generally, the channel length L may be conveniently kept short, e.g., on the order of about 0.5 μm to 2.5 μm. As just referenced, desired operational characteristics for short-circuit performance may be obtained by using the ratio of the channel dose to the selected channel length.

The pinch-off of the N region 116a may be controlled in part, e.g., by implantation. For example, there may be vertically-varying doping concentrations in 118, 116 and 120, with doping profiles controlled by implantation energies and doses. For example, a line between the gate 108 and drain 104 may be used to define the vertical or depth direction.

Figure 3:
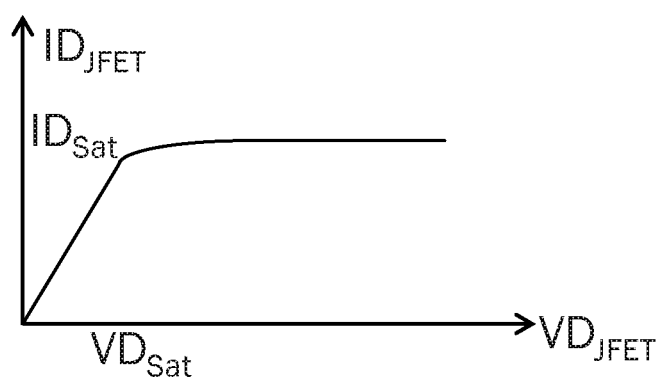
FIG. 3 is a graph showing an example current/voltage characteristic for the of FIG. 2.

FIG. 3 a graph showing an example current/voltage characteristic for the MOSFET(s) of FIGS. 1 and 2. As shown in FIG. 3, and as just described, above, when a drain voltage $V_D$ of the JFET increases, a drain current $I_D$ increases as well, until saturation voltage $V_{DSAT}$ is reached. At this voltage, the JFET current $I_D$ also reaches a saturation value $I_{DSAT}$. By reaching and maintaining the saturation value $I_{DSAT}$, short-circuit protection is provided, and time is provided for fault protection mechanisms to be implemented. The advantage of using the JFET region 202 in series with the SiC MOSFET channel is that the JFET has a low on-resistance adding to the total RDSon of the MOSFET, but it has a pinch-off current which will limit the maximum short-circuit current of the MOSFET, as shown in FIG. 3. A conventional SiC MOSFET will not have this saturation behaviour, leading to significantly higher short-circuit currents and reduced short-circuit capability.

FIGS. 4-8 illustrate example processing steps that may be used to obtain the example MOSFET structures of FIGS. 1 and 2, or similar MOSFET structures. FIG. 9 is a flowchart illustrating example operations of the processing of FIGS. 4-8. In the following description, discussion of FIGS. 4-8 also references specific, corresponding operations of FIG. 9.

Figure 4:
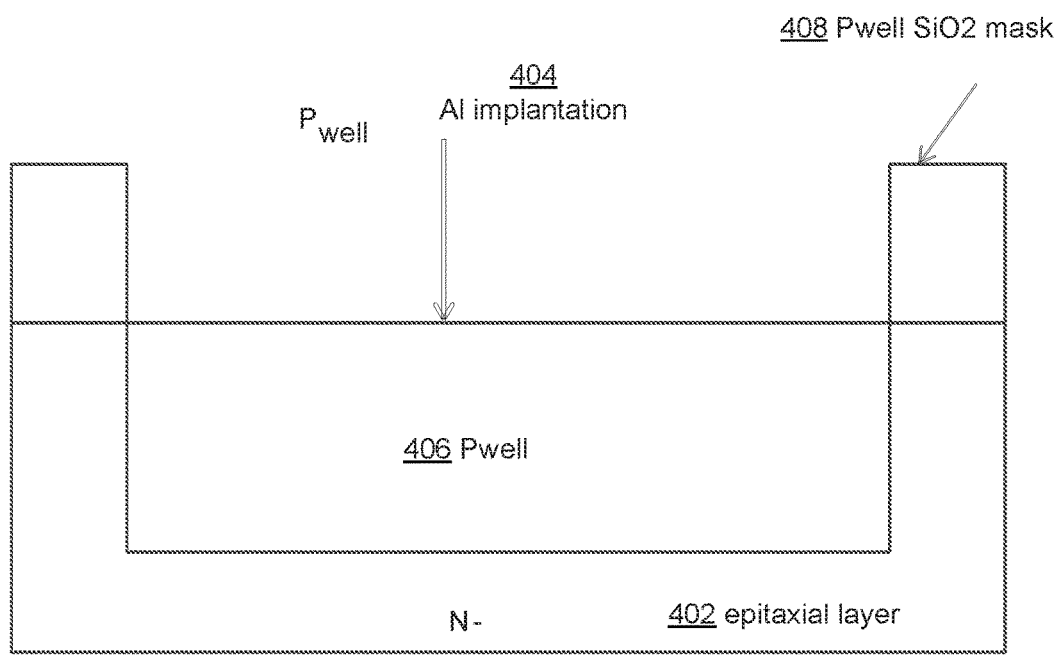
FIG. 4 illustrates example processing step(s) that may be used to obtain the example MOSFET structures of FIGS. 1 and 2, or similar MOSFET structures.

In FIG. 4, an epitaxial layer 402 is formed as a lightly doped N– layer, corresponding to drift region 106 of FIGS. 1 and 2, and Al implantation 404 is performed to form $P_{well}$ 406, using mask 408 (902). For example, a hot implantation at 600 C may be implemented.

Figure 5:
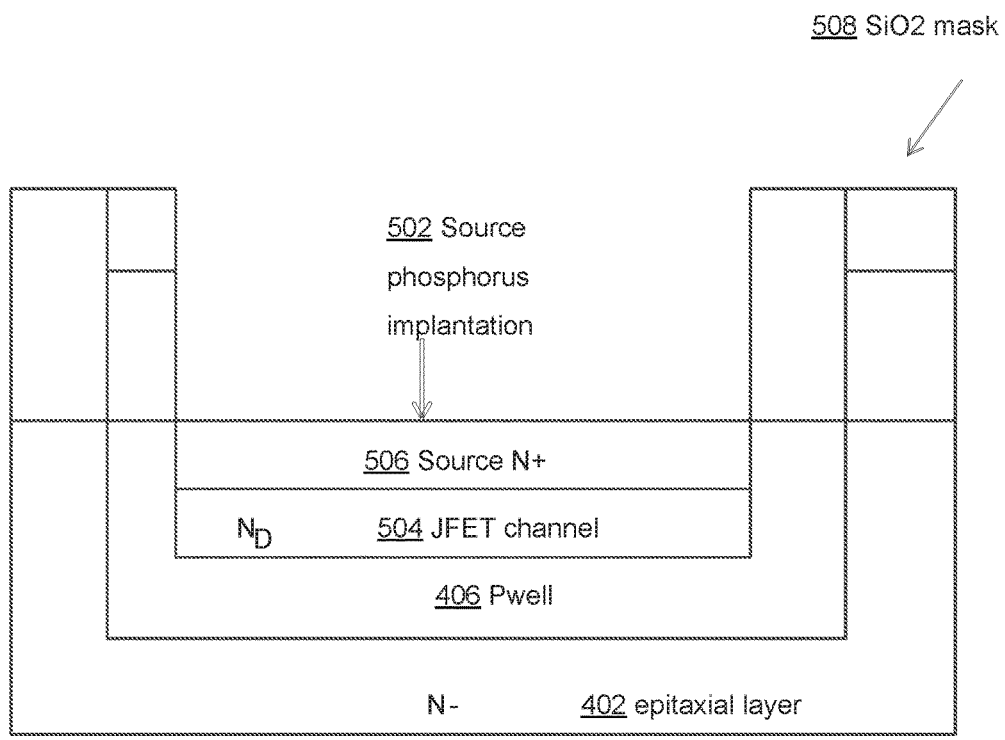
FIG. 5 illustrates further example processing step(s) of the processing of FIG. 4.

In FIG. 5, a phosphorous implantation 502 is performed to form the JFET channel 504, using mask 508 (904). For example, an intermediate source doping (e.g., 1e18 cm$^{-3}$ range) may be performed at the JFET channel depth. Further implantation 502 is used to form N+ region 506, again using mask 508 (906). The described and illustrated implantation 502 uses, e.g., SiO$_2$ mask 508, since corresponding deposition and etch-back of SiO$_2$ may be used to form a spacer for self-aligned, accurate MOSFET channel (length) definition. Moreover, as referenced above, the $N_D$ concentration of region 504 may be implanted to a suitable depth to obtain desired $R_{DSON}$/short-circuit characteristics.

Figure 6:
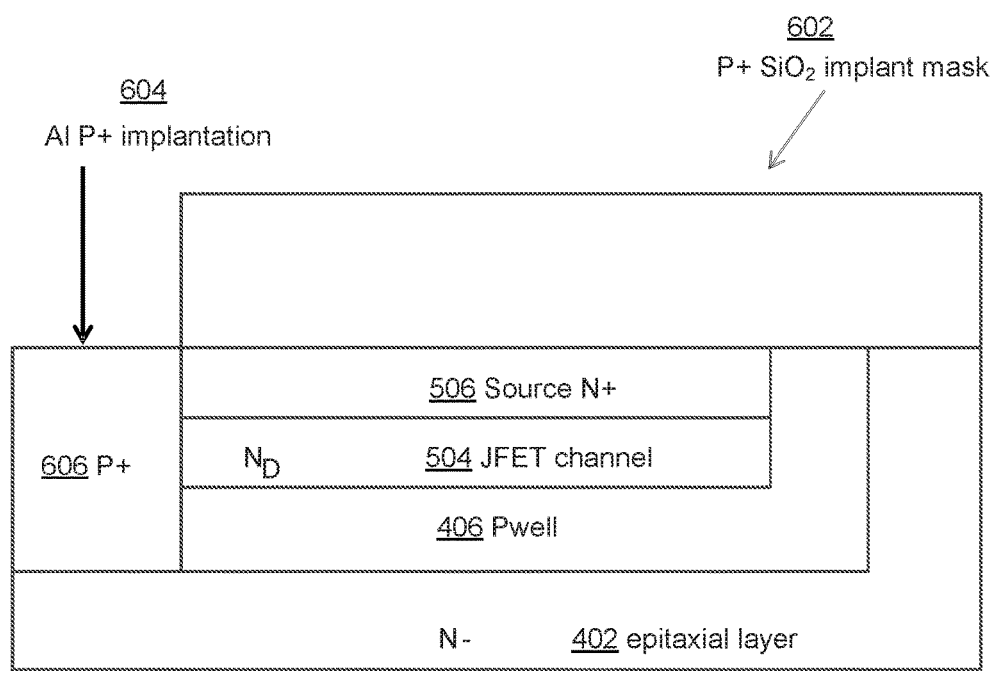
FIG. 6 illustrates further example processing step(s) of the processing of FIGS. 4 and 5.
Figure 7:
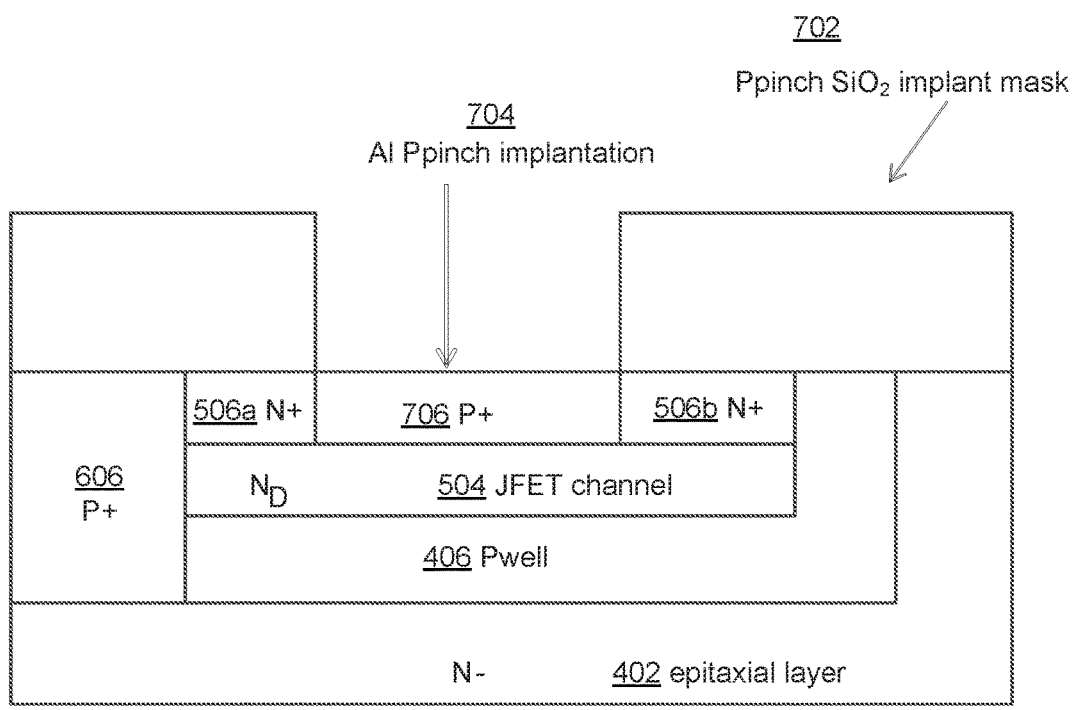
FIG. 7 illustrates further example processing step(s) of the processing of FIGS. 4-6.

In FIG. 6, a P+ implant SiO$_2$ mask 602 is used to perform Al P+ implantation and thereby contact the surface to the $P_{well}$ region (908). In FIG. 7, a $P_{pinch}$ SiO$_2$ implant mask 702 is used to perform $P_{pinch}$ implantation and thereby create the top (first) p-gate region 706 (910). In other implementations, it is possible to combine the $P_{pinch}$ implant with the $P_{plus}$ mask.

Figure 8:
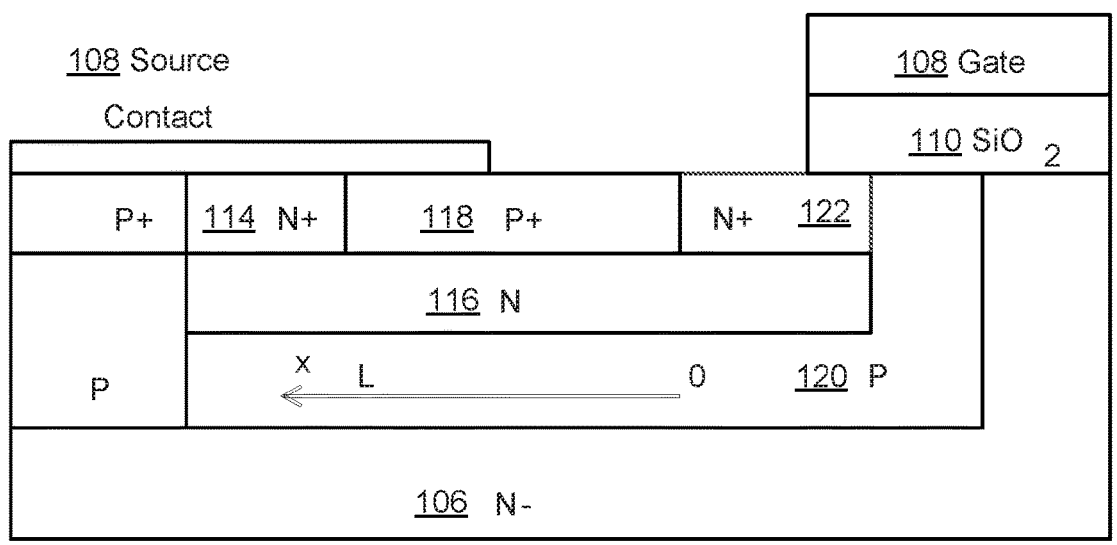
FIG. 8 illustrates further example processing step(s) of the processing of FIGS. 4-7.
Figure 9:
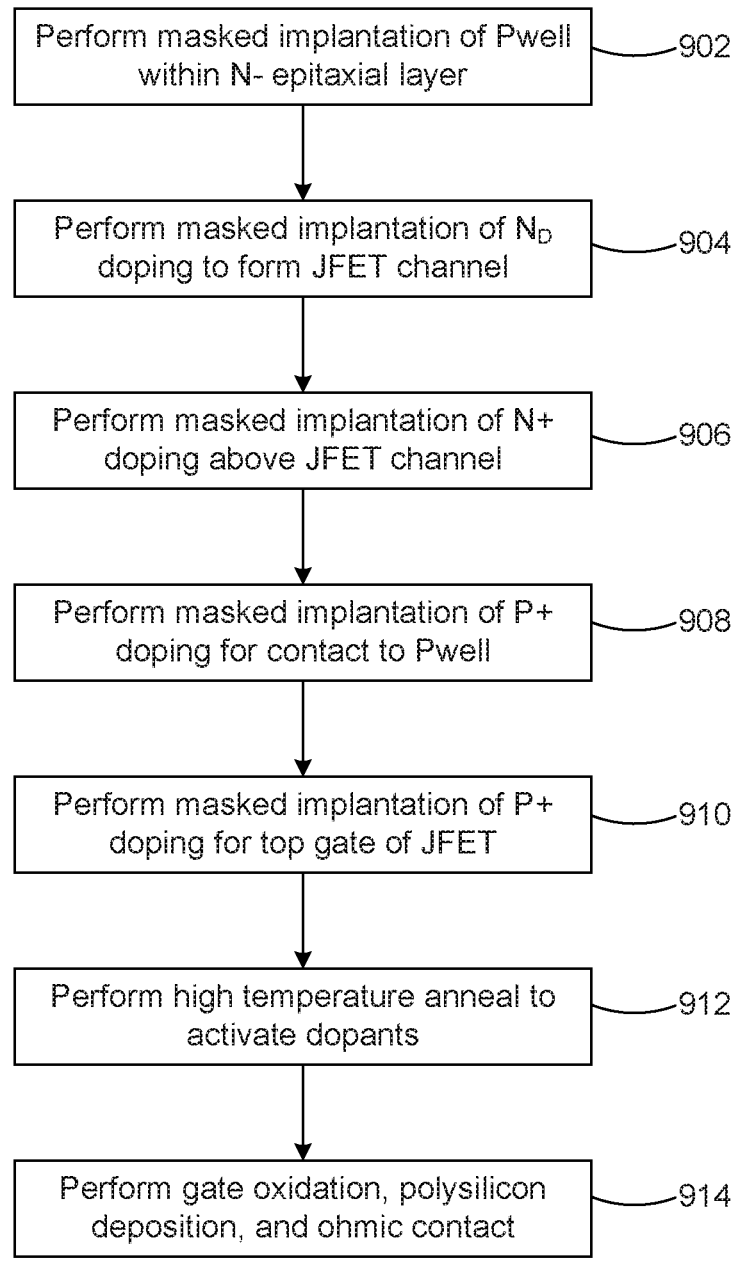
FIG. 9 is a flowchart illustrating example operations of the processing of FIGS. 4-8.

In FIG. 8, a final version of the processed MOSFET with included JFET is illustrated, here with notations and reference numerals corresponding to those of FIGS. 1 and 2. As shown and referenced in the flowchart of FIG. 9, high temperature annealing may be performed (e.g., at 1600-1700 C) to activate the various dopant atoms (912). A SiC surface may be covered by a carbon cap during this step. Finally in FIG. 9, gate oxidation with post oxidation anneal, poly deposition and patterning, as well as ohmic contact formation, may be performed following the high temperature annealing (914).

Figure 10:
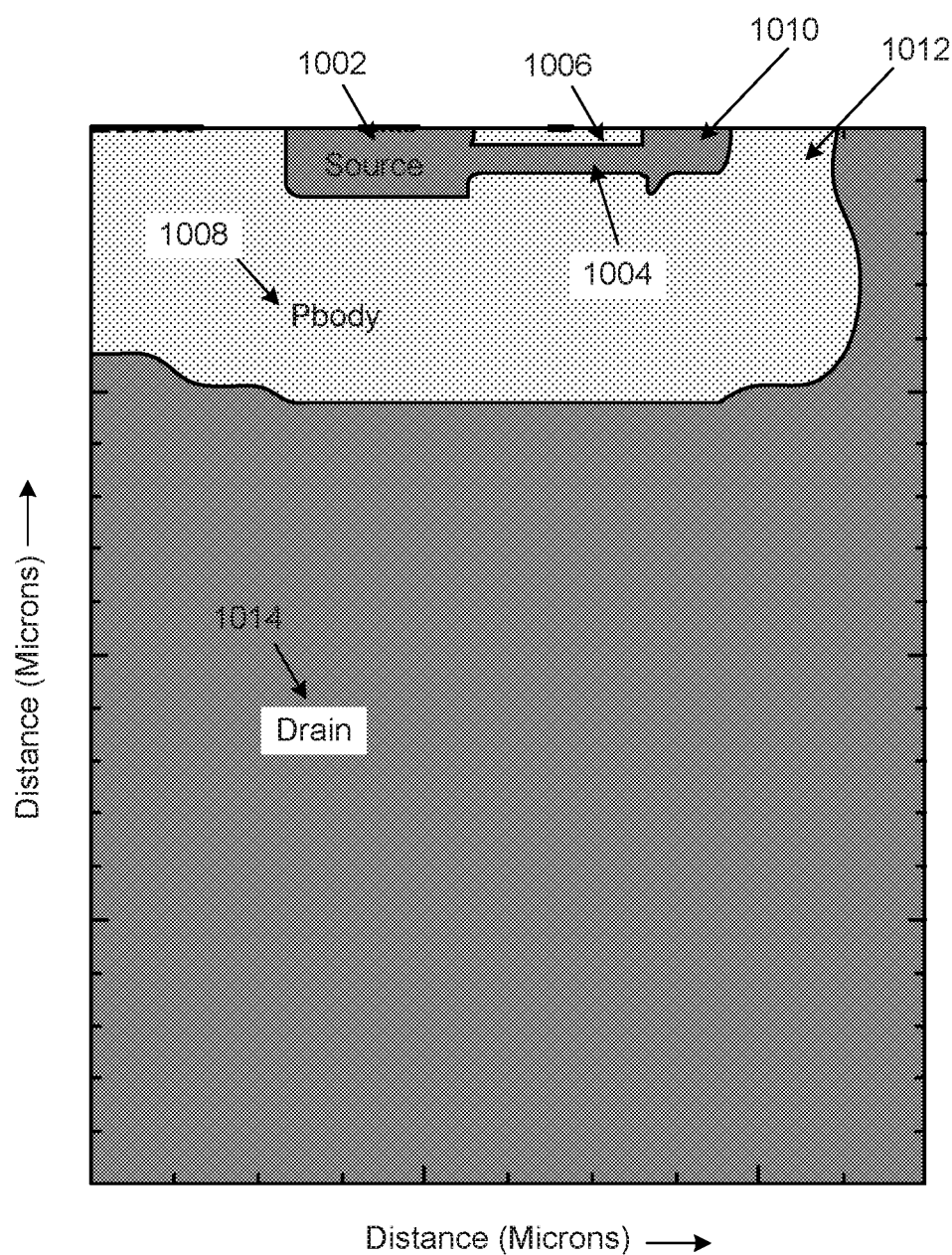
FIG. 10 illustrates a device used for simulation/testing of an example implementation of the MOSFET structure(s) of FIGS. 1-2.
Figure 11:
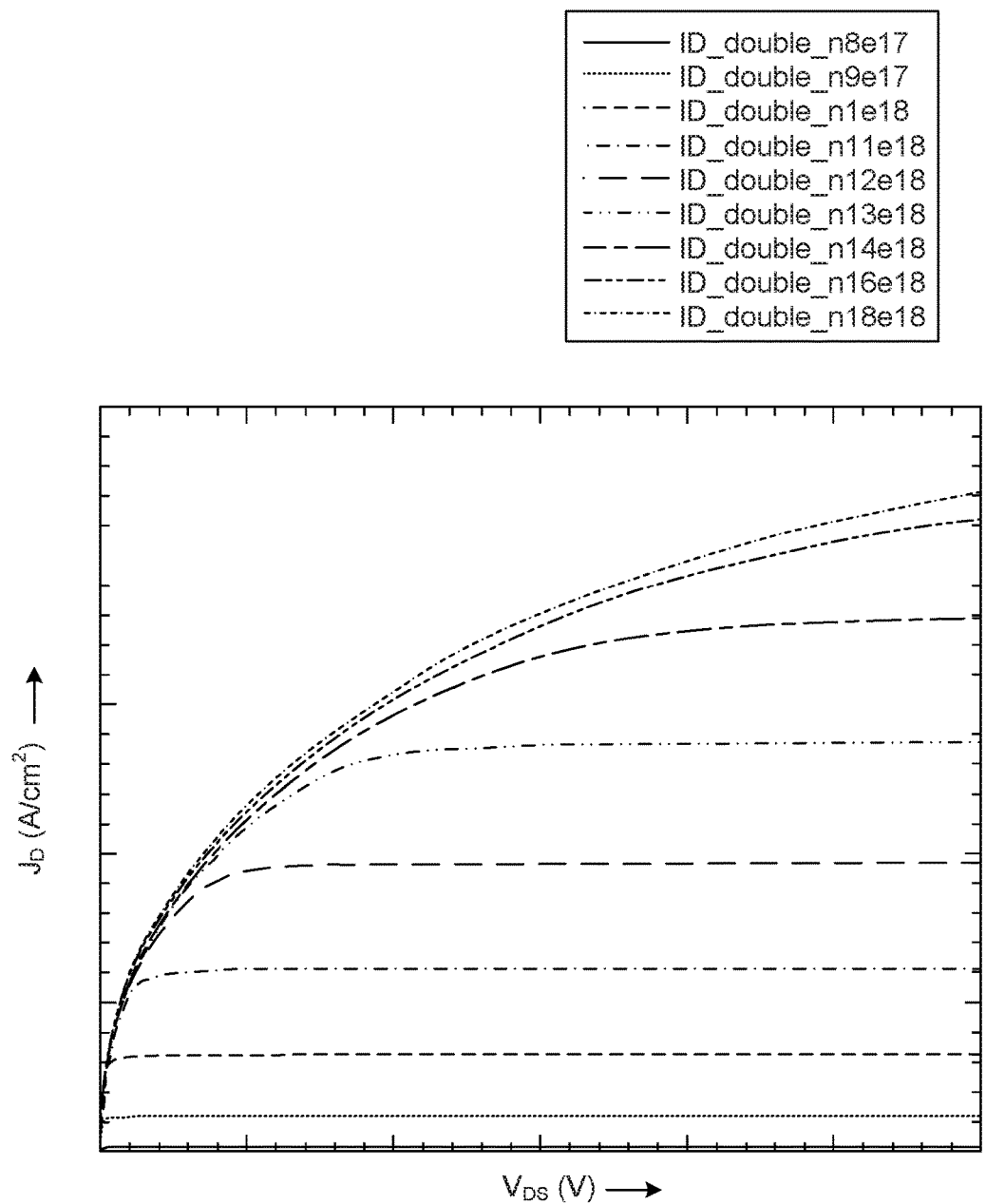
FIG. 11 is a first graph illustrating results obtained using the example of FIG. 10.
Figure 12:
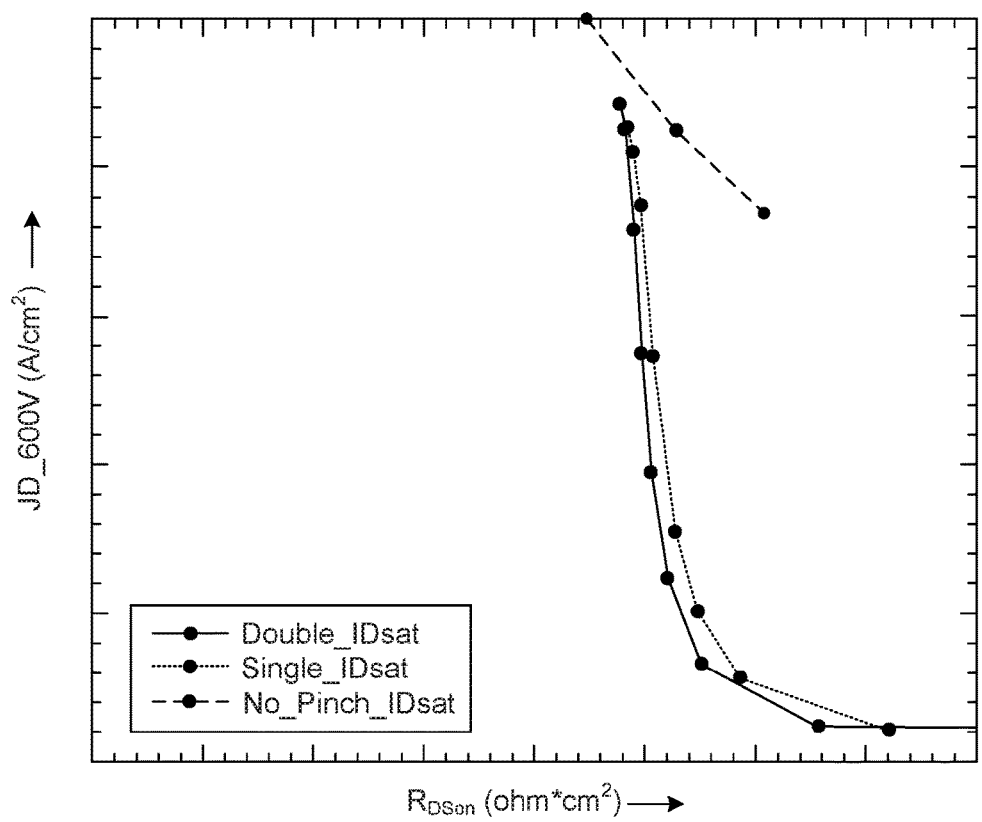
FIG. 12 is a second graph illustrating results obtained using the example of FIG. 10.

FIG. 10 illustrates a device used for simulation/testing of an example implementation of the MOSFET structure(s) of FIGS. 1-2, results of which are illustrated in the graphs of FIGS. 11-13. In FIG. 10, a source region 1002 is in series with the JFET channel (pinch resistance) 1004, which is formed between first (top) gate 1006 and second (bottom) gate 1008. Drain region 1010 completes the JFET structure, while the MOSFET channel region 1012 is formed between the JFET drain 1010 and the MOSFET drain region 1014.

With respect to FIG. 10, device simulations of $I_D$-$V_{DS}$ characteristics up to VDS=600 V were performed for 1200 V SiC MOSFETs. The doping concentration in the pinch resistance 1004 was varied, in order to tune the specific on-resistance and the short-circuit current density of various implementations.

FIG. 11 illustrates strong reduction of current density at VDS=600 V, with a very small penalty in RDSon, due to the described pinch resistance, and including use of the double-gate JFET structure. ID-VDS characteristics show true saturation characteristics, due to the pinch resistance described herein. SiC MOSFETs are especially well-suited for use of a pinch resistance in series with source, because, e.g., negative feedback is provided on $V_{GS}$ as the current increases, and $R_{DSon}$ has significant dependence on $V_{GS}$ in SiC MOSFETs (due to, e.g., SiC/SiO$_2$ interface traps).

FIG. 12 shows simulated short-circuit current density at 600 V vs. specific on-resistance for the implementations described herein (Double_IDsat), compared to a conventional SiC MOSFET (No_Pinch_IDsat), and for a series connected JFET with a single-sided gate (Single_IDsat). The data points for the Double_IDsat and for the single-sided gate were generated by varying the doping concentration ND in the JFET channel region, and the data points for the conventional SiC MOSFETs were generated by reducing the channel density on the die. It is clear from this comparison that the use of a double-gated JFET in series with the SiC MOSFET channel dramatically reduces the short-circuit current density at the cost of a modest increase of $R_{DSon}$. By carefully tuning $N_D$ in the JFET channel region, it is possible to select a suitable trade-off between $R_{DSon}$ and short-circuit capability for different applications. A similar effect can be achieved using the single-sided gate JFET but the trade-off between $R_{DSon}$ and short-circuit current density is significantly worse. For the single-side gate JFET manufacturing in volume is also expected to be more difficult since this concept will be sensitive to surface charge, consumption of SiC by oxidation and over-etch into SiC, whereas the invention does not suffer from these limitations because the JFET channel is buried below a highly doped P+ region.

As illustrated and described above with respect to FIGS. 1-12, a low $R_{DSon}$, combined with improved short-circuit capability, is enabled with a highly-tunable approach that provides a desired trade-off between these two aspects, all of which will continue to be important as SiC MOSFETs with even lower $R_{DSon}$ values are developed (e.g., using reduced cell pitch, lower parasitic JFET resistance and possibly higher channel mobility). The described features are utilized in many important applications, such as motor drive systems, including drivetrains in electric and hybrid electric vehicles.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device, comprising:
    a source region configured to provide at least a portion of a MOSFET source of a MOSFET and at least a portion of a JFET source of a JFET;
    a JFET channel region in series with the source region and a MOSFET channel region of the MOSFET, and disposed between a first JFET gate and a second JFET gate; and
    a JFET drain disposed at least partially between a gate insulator of a gate of the MOSFET and at least a portion of the JFET channel region, and in electrical contact with the first JFET gate and the second JFET gate.

2. The semiconductor device of claim 1, wherein the JFET channel region provides pinch-off of short-circuit current of the MOSFET during a short-circuit event of the MOSFET.

3. The semiconductor device of claim 2, wherein, in the JFET channel, a doping concentration, a width $W_{JFET}$ and a length L are configured to cause the pinch-off to occur at a specified short-circuit current.

4. The semiconductor device of claim 3, wherein a JFET channel dose $N_D \cdot W_{JFET}$ for a value of L is configured to cause the pinch-off to occur at a specified short-circuit current.

5. The semiconductor device of claim 1, wherein the first JFET gate and the second JFET gate are electrically connected to the source region.

6. The semiconductor device of claim 1, wherein the first JFET gate is disposed between a surface of the semiconductor device and at least a portion of the JFET channel region.

7. The semiconductor device of claim 1, wherein the JFET drain is disposed at least partially at a surface of the semiconductor device, and between the first JFET gate and the MOSFET channel region.

8. The semiconductor device of claim 1, wherein the MOSFET is a vertical power Silicon Carbide (SiC) MOSFET.

9. The semiconductor device of claim 1, wherein a source contact of the source region is in electrical contact with the source region, the first JFET gate, and the second JFET gate.

10. A semiconductor device, comprising:
    a MOSFET; and
    a JFET in series with a MOSFET channel region of the MOSFET, the JFET having a first JFET gate and a second JFET gate, both the first JFET gate and the second JFET gate being shorted to a JFET source of the JFET, wherein the first JFET gate is disposed between a surface of the semiconductor device and a JFET channel region of the JFET, and a JFET drain of the JFET is disposed between the first JFET gate and the MOSFET channel region.

11. The semiconductor device of claim 10, wherein the JFET channel region provides pinch-off of short-circuit current of the MOSFET during a short-circuit event of the MOSFET.

12. The semiconductor device of claim 11, wherein, in the JFET channel region, a doping concentration, a width $W_{JFET}$ and a length L are configured to cause the pinch-off to occur at a specified short-circuit current.

13. The semiconductor device of claim 12, wherein a ratio of $(N_D \cdot W_{JFET})/L$ is configured to cause the pinch-off to occur at a specified short-circuit current.

14. The semiconductor device of claim 10, wherein a drain current of the JFET, $ID_{JFET}$, reaches a saturation current $ID_{SAT}$ at a saturation drain voltage of the JFET, $VD_{SAT}$.

15. The semiconductor device of claim 10, comprising a source region configured to provide at least a portion of a MOSFET source of the MOSFET and at least a portion of the JFET source of the JFET.

16. The semiconductor device of claim 10, wherein the JFET drain is disposed at least partially at the surface of the semiconductor device.

* * * * *